United States Patent [19]

Weidner

[11] Patent Number: 5,719,510
[45] Date of Patent: Feb. 17, 1998

[54] SOFTWARE CONFIGURABLE DIGITAL CLOCK GENERATOR

[75] Inventor: Albert Weidner, Tempe, Ariz.

[73] Assignee: Intel Corporation, Santa Clara, Calif.

[21] Appl. No.: 622,375

[22] Filed: Mar. 27, 1996

[51] Int. Cl.[6] .................................................. H03B 19/00
[52] U.S. Cl. .............................. 327/119; 327/115; 377/47
[58] Field of Search ........................... 327/105, 113–117, 327/119–122, 291, 298; 377/47, 48; 331/51, 53

[56] References Cited

U.S. PATENT DOCUMENTS 3,970,954  7/1976  Even ......................................... 327/119
5,398,007  3/1995  Yamazaki et al. ....................... 327/115

Primary Examiner—Timothy P. Callahan
Assistant Examiner—Eunja Shin
Attorney, Agent, or Firm—Blakely, Sokoloff, Taylor & Zafman

[57] ABSTRACT

The clock generator generates an output clock signal of known frequency from an internally generated high frequency signal of unknown frequency and from a low frequency input signal of known frequency. To this end, the clock multiplier first determines the frequency of the internal clock signal from a comparison with the input clock signal. In one arrangement, the frequency of the internal signal is determined by counting a number of clock transitions occurring during the internal signal within one period of the input clock signal. Once the frequency of the internal signal has been determined, the clock multiplier generates an output clock signal based upon the internal clock signal but adjusted in accordance with the newly determined frequency of the internal clock signal. In one arrangement, the clock multiplier employs a programmable divider. A software control unit calculates a divide factor for use by the programmable divider based upon the period of the input signal, the count of transitions, and the desired period for the output signal. The internal signal is then routed through the programmable divider to divide the signal by an amount sufficient to produce an output signal having a period approximately equal to the desired output period. In one specific arrangement, the internal signal is generated by a ring oscillator which produces an internal signal having a frequency of, for example, 300 megahertz (MHz) to 500 MHz. The programmable divider divides the internal signal by a divide factor between 6 and 10 to yield an output frequency of about 50 MHz. The clock multiplier also includes a mechanism for determining whether the actual frequency of the output signal remains within an acceptable range of frequencies and for reprogramming the programmable divider, if necessary, to reset the output frequency to within the acceptable range of frequencies. Method and apparatus embodiments of the invention are described.

12 Claims, 4 Drawing Sheets

SOFTWARE CONFIGURABLE DIGITAL CLOCK GENERATOR

BACKGROUND OF THE INVENTION

1. Field of the Invention

The invention generally relates to digital clock generators for use in integrated circuits (ICs) and in particular to digital clock generators of the type which generate a high frequency internal clock signal for use within an IC based upon a relatively low frequency, known, input clock signal.

2. Description of the Related Art

Digital clock generators are commonly employed within ICs to generate internal clock signals based upon an input reference clock signal provided by a motherboard system bus or the like. Clock generators are typically configured to generate an internal clock signal that has a substantially higher frequency than the input signal. This is commonly performed to allow the IC to operate at a much higher frequency than can be provided by a system bus reference clock signal. As an example, a clock generator may be provided to generate a 100 megahertz (MHz) internal clock signal based upon a system bus clock signal of only 10 MHz. Such generators are often referred to as clock multipliers.

Often clock generators of the clock multiplier type are configured as phase lock loop (PLL) circuits. More specifically, the clock generator includes a phase-frequency detector, a charge pump, a loop filter and a voltage controlled oscillator (VCO) connected in series between an input reference clock line, such as a system bus clock line, and an internal clock line, such as a core clock line. The VCO is configured to generate an output clock signal having a frequency that is some multiple N of an input clock signal frequency. The VCO generates a high frequency output signal as a function of a voltage signal generated by capacitors of the loop filter and input to the VCO. A feedback path, containing a divide-by-N circuit, interconnects an output of the VCO with a feedback input of the phase-frequency detector.

With this arrangement, the phase-frequency detector receives both the input clock reference signal and a feedback signal. The phase-frequency detector is configured to generate output signals representative of differences between the input reference signal and the feedback signal. The charge pump increases or decreases an amount of charge contained within the capacitors of the loop filter to thereby increase or decrease the voltage applied to the input of the VCO. Accordingly, the output frequency generated by the VCO is likewise increased or decreased based upon differences between the input reference frequency and the previous output frequency of the VCO. Ultimately, the components of the clock multiplier achieve a phase lock wherein the output frequency of the VCO is maintained fairly precisely at N times the frequency of the input reference signal. In the following, such clock multiplying PLLs will be referred to as "closed-loop" clock multipliers because the feedback loop allowing output frequencies to be compared against input reference frequencies are configured as a closed hardware loop.

Although such closed-loop clock multipliers operate effectively for many applications, problems remain. In particular, a significant period of time, in terms of internal clock signal periods, may elapse before the PLL achieves a phase lock. During this period of time, the other components of the IC including, for example, core logic components cannot be reliably used. As such, a significant delay occurs before the IC can be operated. For many applications, the delay is unacceptable. Also, PLLs are typically very sensitive to input noise, including clock jitter, which may prevent a phase lock from occurring or, if phase lock has already been achieved, may significantly perturb the phase lock resulting in unusable internal clock signals.

Moreover, closed-loop clock multipliers typically have limited flexibility. Often the clock multiplier is designed to operate within only a relatively narrow range of input frequencies to generate a relatively narrow range of output frequencies based upon a pre-set clock multiplication ratio. With such clock multipliers it is not feasible to simply change the clock multiplication ratio, such as from four to five. Indeed, to provide an alternative clock multiplication ratio or to accommodate different ranges of input frequencies, the clock multiplier must be redesigned, perhaps to provide different resistance and capacitive values for resistors and capacitors within the loop filter of the clock multiplier. Hence, once an IC has been fabricated with such a clock multiplier, the range of frequencies with which the IC may operate may be severely limited.

Still other problems can occur with conventional closed-loop clock multipliers. In particular, VCOs employed therein are often very sensitive to temperature, process, and other variations. These factors tend to reduce the permissible range of frequencies in which the PLL may reliably operate, causing even greater sensitively to noise and jitter and further delay in the time required to achieve a phase lock.

Accordingly, it would be desirable to provide an improved clock generation method and apparatus and it is to that general end that aspects of the present invention are drawn.

SUMMARY OF THE INVENTION

In accordance with the invention, a clock multiplier is provided which includes a means for generating an internal signal of unknown frequency and a means for receiving an input signal of known frequency. The multiplier also includes means for determining the frequency of the internal signal from a comparison with the known frequency of the input signal and a means for generating, from the internal signal, an output signal of known frequency, with the output signal having a frequency approximately equal to a pre-selected desired frequency. In one arrangement, the frequency of the internal signal is very much greater than both the frequency of the input signal and the desired frequency. The means for generating the output signal divides the internal signal by an integer number determined based upon a comparison of the determined frequency of the internal signal and the desired frequency of the output signal.

DETAILED DESCRIPTION OF EXEMPLARY EMBODIMENTS OF THE INVENTION

With reference to the figures, exemplary embodiments of the invention will now be described. The exemplary embodiments are described primarily with reference to block diagrams and flowcharts. As to the flowcharts, each block within the flowchart represents both a method step and an apparatus element for performing the method step. Herein, the apparatus element may be referred to as a means for, an element for, or a unit for performing the method step. As to the block diagrams, it should be appreciated that not all components necessary for complete implementation of a practical system are always illustrated or described in detail. Rather, only those components necessary for a thorough understand of the invention are illustrated and described. Furthermore, components which are either conventional or may be readily designed and fabricated in accordance with the teachings provided herein are not described in detail.

Figure 1:
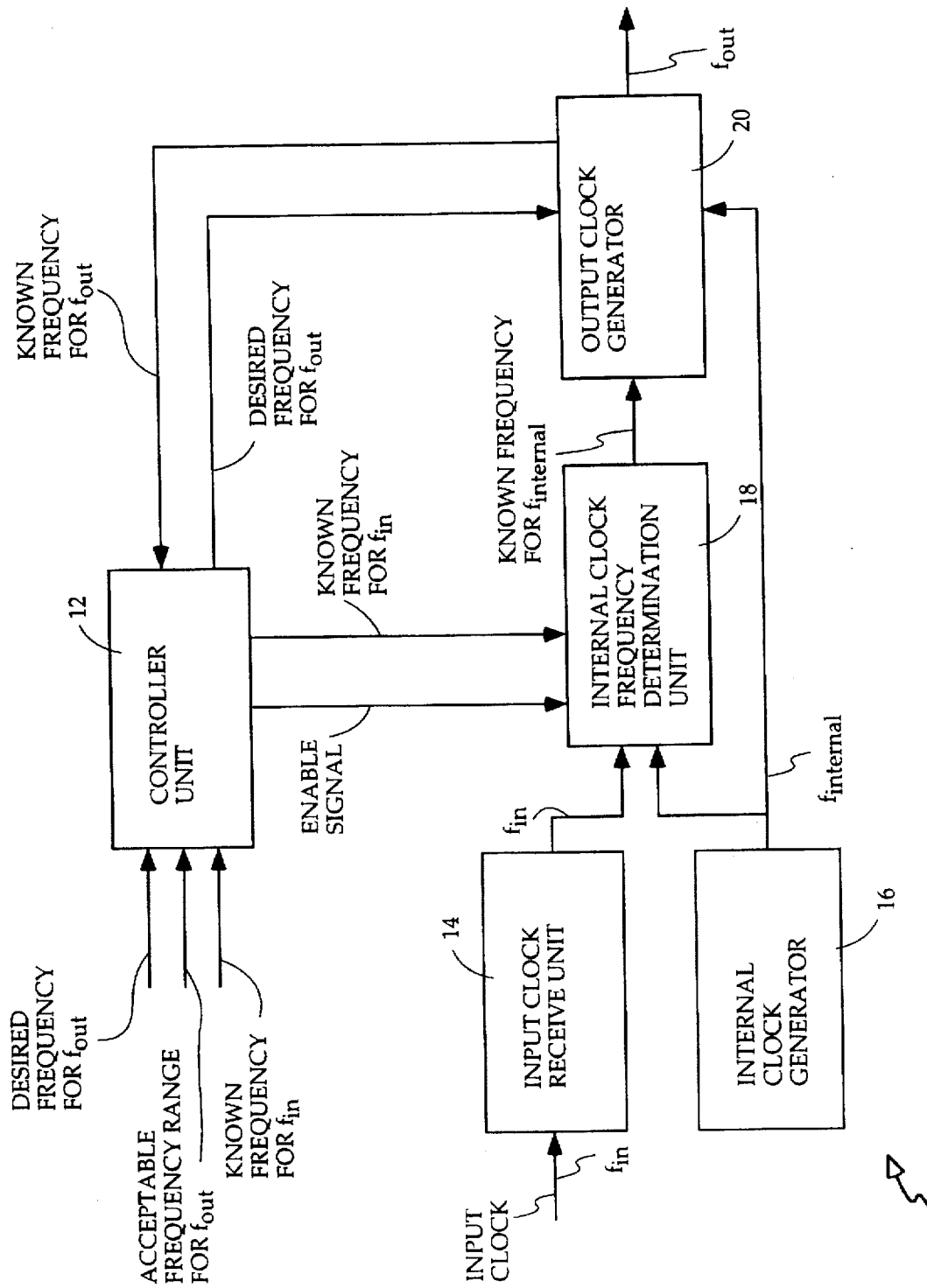
FIG. 1 is a high level block diagram illustrating an exemplary embodiment of the digital clock generator of the invention.

FIG. 1 is a block diagram of a clock multiplier 10 configured to generate an output clock signal of frequency $f_{out}$ based upon an internal clock signal of an initially unknown frequency $f_{internal}$. The system receives an input or reference clock signal having a frequency $f_{in}$, a value representative of that frequency, a desired frequency for the output signal and an acceptable frequency range for the output signal. The clock multiplier first determines the precise frequency of the internal clock signal then generates the output clock signal from the internal clock signal by adjusting the internal clock signal to yield a clock signal having approximately the desired output frequency $f_{out}$. The frequency of the output clock signal is monitored to determine whether it remains within the acceptable frequency range and, if not, the output signal is adjusted to return to within the acceptable range.

The clock multiplier includes a controller unit 12, and input clock receive unit 14, an internal clock generator 16, an internal clock frequency determination unit 18, and an output clock generator 20. The controller unit receives the desired output frequency, the acceptable frequency range, and the value representing the known input frequency. The controller unit forwards the known input frequency value to the internal clock frequency determination unit, which also receives the internal clock signal from the internal clock generator and the input clock signal from the input clock receive unit. Upon the receipt of an enable signal from the controller, the internal clock frequency determination unit compares the internal clock signal with the input clock signal and, using the known frequency value received from the controller unit, determines or calculates the frequency of the internal signal. This determination may be performed using a variety of techniques. For example, the determination unit can determine the ratio of the frequencies of the internal signal to the input signal, then multiply the ratio by the known frequency for the input signal. In an embodiment to be described below with reference to FIGS. 2 and 3, the ratio is determined by counting the number of clock transitions occurring within the internal clock signal during one clock period of the input clock signal, but other techniques may be employed as well.

Once the frequency of the internal signal is known, a value representative of the internal frequency is forwarded to the output clock generator, which also receives both the internal clock signal itself and a value representative of the desired frequency for the output signal. The clock generator generates the output signal to have approximately the desired frequency by adjusting the internal signal by an amount based upon a comparison of the known frequency for the internal signal and the desired frequency of the output signal. Again, a variety of techniques may be employed. In one technique, also to be described below, the output clock generator divides the internal clock signal by a divide factor which is related to the ratio between the internal frequency and the desired frequency.

Hence, ultimately, an output clock signal, having a frequency set approximately to the desired frequency, is output from the clock multiplier. In one embodiment, the output clock signal is employed within core logic circuitry (not shown) contained within an IC incorporating the clock multiplier. The IC itself is employed within a larger system, such as a computer system, along with other ICs, each possibly also incorporating the clock multiplier of FIG. 1 and each receiving as an input clock signal a system clock provided by a system bus.

As noted, the clock multiplier attempts to maintain the frequency of the output signal within the acceptable range of frequencies input by the controller. To this end, the output clock generator transmits a value to the controller that is representative of the actual frequency of the output signal. The controller compares the actual frequency of the output signal to the acceptable range of frequencies. If the actual frequency does not lie within the acceptable range, the controller re-transmits the enable signal to the determination unit causing the determination unit to recalculate the frequency of the internal clock signal and forward a new frequency value to the output clock generator, which then begins generating a new output clock signal using the new frequency value for the internal signal along with the original desired frequency for the output signal. During operation, the controller readjusts the frequency of the output signal numerous times, perhaps as a result of deviations in the frequency of the signal provided by the internal clock generator caused by changes in temperature.

At any time, the controller may also receive a new desired output frequency. If so, the new frequency is transmitted to the output clock generator which generates a new output clock signal at approximately the desired frequency. If the new output clock frequency differs from the acceptable range, the controller again transmits the enable signal to the determination unit to trigger a new determination of the frequency of the internal clock signal ultimately resulting in an adjustment of the frequency of the output clock signal to lie within the acceptable frequency range. Also, at any time, the input clock signal may be changed in frequency. If so, a new known frequency for the input signal is received by the controller which triggers the determination unit to again recalculate the frequency of the internal signal based upon the new input frequency and a new output clock signal is generated. The known frequency for the input signal may be provided externally to the IC containing the clock multiplier, perhaps through programming pins. Alternatively, a frequency determination unit may be connected to the input clock line for determining the frequency thereof in accordance with conventional techniques. Likewise, a determination of the frequency of the output signal performed by the output clock generator may be performed in accordance with conventional techniques. In one technique, to be described below, the output generator does not actually calculate the frequency of the output signal, rather the determination unit includes a counter which counts clock transitions within the internal clock and forwards the count directly to a programmable comparator for comparison with a range of acceptable count values that correspond to a range of acceptable frequencies. The controller may be implemented using any of a variety of techniques as well. For example, the controller may be a hardware state machine. In the embodiment described below, the controller is implemented as a software program running within programmable microprocessor logic connected to, or formed within, the IC containing the clock multiplier itself. Again, a wide range of alternative techniques may be employed.

Thus, the clock multiplier of FIG. 1 generates an output clock signal of known frequency using an internal clock signal of initially unknown frequency and further operates to maintain the frequency of the output signal within a predetermined acceptable range. Although the clock multiplier employs a feedback loop wherein the actual frequency of the output signal is compared against the acceptable frequency range, no phase lock loop is required. Indeed, no VCO, charge pump, loop filter or other phase lock loop components are needed. Hence, the clock multiplier of FIG. 1 is not limited by the disadvantages described above in the Background of the Invention section occurring within some conventional clock multiplying PLLs. In particular, the clock multiplier of FIG. 1 can immediately output a clock signal without first requiring that a phase lock be achieved. The frequency of the output clock may be initially set to a low value that can be reliably generated based upon the internal clock signal even if the internal clock signal is initially somewhat unstable. As the internal clock signal becomes more and more stable, the frequency of the output signal can be increased accordingly. As such, if employed within a microprocessor or microcontroller, the microcontroller can initially operate at a clock rate of perhaps 5–10 MHz before being quickly increased to a more optimal clock rate such as 30–50 MHz. Also, unlike a clock multiplying PLL which can be very inflexible, the clock multiplier of FIG. 1 can be easily reprogrammed with new input frequency values. Indeed, if the controller itself is implemented in software, the logic performed by the controller may be reprogrammed as well, perhaps to provide additional features. For example, a software controller can be reprogrammed to automatically provide for incrementally increasing frequencies from a starting default frequency to an optimal operational frequency. As another example, if implemented within a system provided with limited power resources, the software controller can be programmed to generate an output clock of a lower frequency to conserve power. In this regard, although not shown, an apparatus can be provided for detecting the remaining amount of power available and for transmitting a signal to the controller representative of that amount of power. The controller then selects the desired output signal frequency based upon the amount of power remaining to ensure that the system can continue to operate, although at a lower clock rate.

Figure 2:
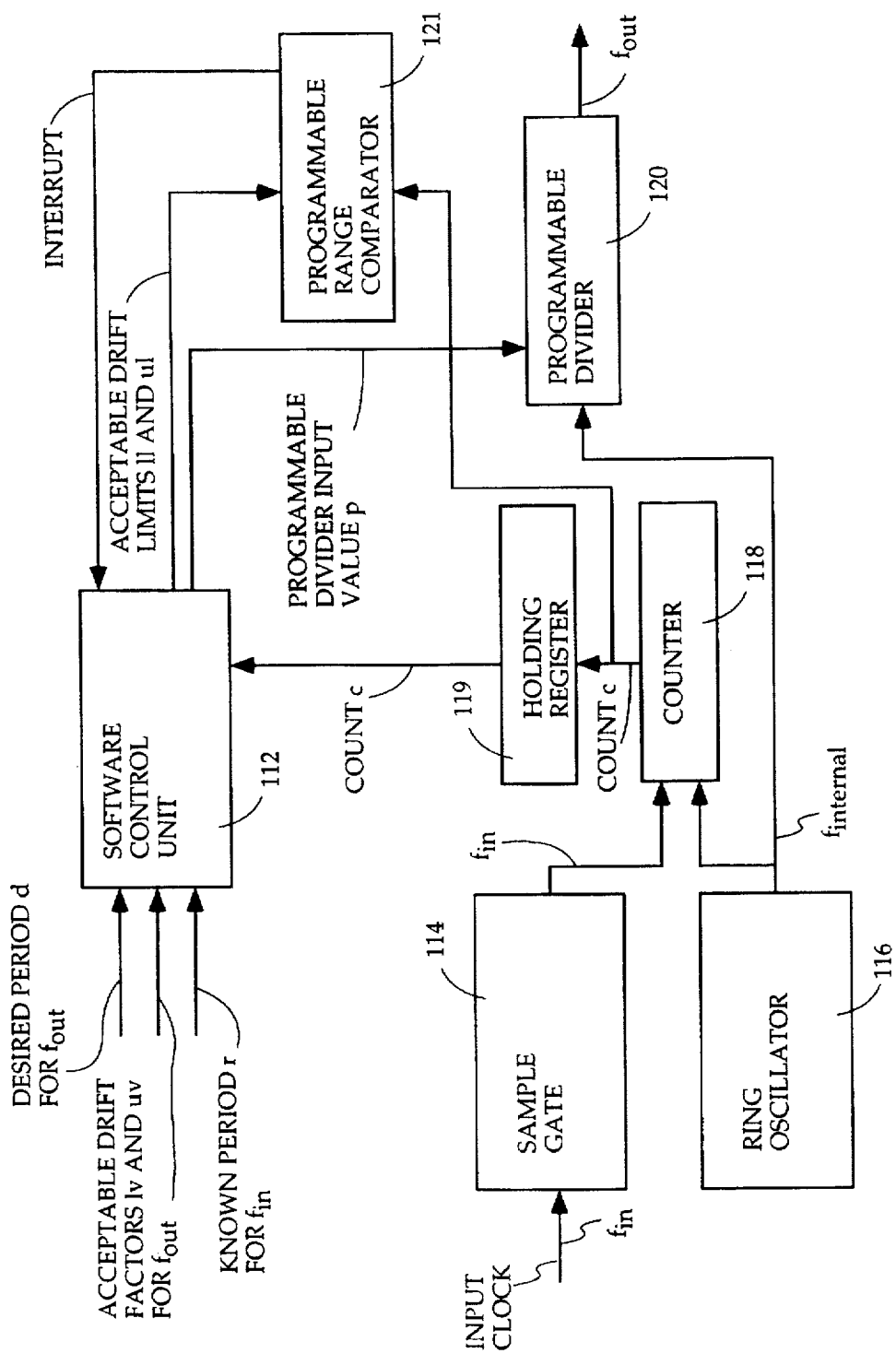
FIG. 2 is a block diagram illustrating a specific implementation of the clock generator of FIG. 1.

FIG. 2 illustrates one specific embodiment of a clock multiplier generally corresponding with the arrangement of FIG. 1. More specifically, FIG. 2 illustrates a clock multiplier 100 having a software control unit 112, an input clock receive unit 114 for receiving an input clock signal having a frequency of $f_{in}$, and a ring oscillator 116 for generating an internal clock signal having an initially unknown frequency $f_{internal}$. The clock multiplier also includes a counter 118 and a count holding register 119, as well as a programmable divider 120 and a programmable range comparitor 121. In use, the clock multiplier first compares the internal frequency with the input frequency to determine the ratio of any frequency difference therebetween then generates an output frequency, at approximately a desired frequency of $f_{out}$, using the internal clock signal and the determined ratio. The clock multiplier also includes components for ensuring that the frequency of the output signal remains within an acceptable range. The embodiment of FIG. 2 is particularly well suited for applications wherein the frequency of the internal clock signal generated by the ring oscillator is very much greater than the desired frequency of the output signal and the frequency of the input signal.

Software control unit 112 coordinates the operation of the other components of the clock multiplier as follows. Initially, the control unit receives an input value d representative of the desired period for the output clock signal, upper and lower acceptable drift variation values uv and lv, and a value r representative of the known clock period for the input clock signal received by sample gate 114. These input values, along with a count value of c, are employed by the control unit to generate a value p for use in programming the programmable divider 120 and acceptable drift limit values of ll and ul for programming range comparitor 121. The value of c represents the number of clock transitions detected within the internal clock signal during one period of the input clock signal. To generate c, the input clock signal and the internal clock signal are both routed to counter 118 which counts the number of clock transitions, either rising edges only or falling edges only, occurring during one clock period of the input clock. In other embodiments, the counter may count the number of transitions occurring during some other portion of the input clock signal such as within two or three consecutive clock periods. The count value of c is transferred to holding register 119 for access by software control unit 112.

The software control unit calculates p from the equation:

$$p=(d*c)/r$$

Initially, p may include a fractional component. If so, p is rounded to the nearest integer number prior to transference to the programmable divider 120.

The programmable divider is a circuit, or other apparatus, configured for generating a clock signal having a frequency of 1/p of the frequency of the internal clock signal. The programmable divider may be any of a variety of convention programmable dividers commonly found within logic circuits and the details of the divider will not further be described. In the exemplary embodiment, the programmable divider is capable of dividing only by an integer value p. In other embodiments, if feasible, it may desirable to provide a programmable divider capable of dividing by fractional values including, for example, half integer values.

The programmable divider receives the value of p and receives the internal clock signal directly from the ring oscillator. The programmable divider divides the internal clock signal by the value p to yield the output signal. By calculating p in the manner described above, the period of the resulting output signal is approximately equal to the desired period d initially received by the software control unit. It should be noted that the output clock period may not be, and typically is not, exactly equal to the desired clock period d. This occurs primarily because the programmable divider divides only by integer values and the actual ratio of the frequency of the internal signal with that of the input signal may include a fractional component.

Accordingly, the actual period of the output signal will likely only be approximately equal to the desired period d. (It also can be guaranteed to be either less than or greater than the exact frequency d.) The precision to which the period of the output signal can be set depends upon the frequency of the internal clock signal, the frequency of the input clock signal, and the desired frequency for the output clock signal. To achieve the highest precision, the frequency of the internal clock should be much greater than the frequency of the input clock signal and the desired frequency for the output clock signal. As such, the value of the programmable divide factor p will be relatively high allowing a significant degree of resolution in selecting the frequency of the output signal. As an example, if the internal clock signal is about 500 MHz, the input clock signal is about 10 MHz, and the desired output frequency is about 50 MHz, then a p value of about 10 can be employed resulting in a precision of about 10% in the frequency of the output signal. In other words, the clock multiplier will be able to generate an output clock signal having a frequency of 50 MHz+or−10%. Also, if the ratio of the internal frequency to that of the desired frequency is great, then variations or drift in the internal frequency can be compensated for by adjusting the p value accordingly to maintain the output frequency within a relatively narrow acceptable range. The foregoing considerations apply primarily within clock multipliers employing a programmable divider capable only of the integer division of signals. If employing a programmable divider capable of the fractional division of signals, then the output frequency can be set with correspondingly greater precision.

Table I below provides a listing of exemplary internal frequencies, corresponding count values, p values and resulting output frequencies. More specifically, Table I provides values corresponding to a range of internal frequencies from 300 MHz to 500 MHz for an arrangement wherein the desired output frequency is about 50 MHz and wherein the frequency of the input clock is about 10 MHz. Accordingly, the desired period d for the output clock is 20 nanoseconds and the known period r for the input signal is 100 nanoseconds.

TABLE I

| Ring Oscillator Frequency (MHz) | Resulting Count (C) | p = (d*c)/r | INT (p) | Resulting Output Frequency (MHz) |
| --- | --- | --- | --- | --- |
| 300 | 30 | 6.0 | 6 | 50 |
| 310 | 31 | 6.2 | 6 | 52 |
| 320 | 32 | 6.4 | 6 | 53 |
| 330 | 33 | 6.6 | 7 | 47 |
| 340 | 34 | 6.8 | 7 | 49 |
| 350 | 35 | 7.0 | 7 | 50 |
| 360 | 36 | 7.2 | 7 | 51 |
| 370 | 37 | 7.4 | 7 | 53 |
| 380 | 38 | 7.6 | 8 | 47.5 |
| 390 | 39 | 7.8 | 8 | 49 |
| 400 | 40 | 8.0 | 8 | 50 |
| 410 | 41 | 8.2 | 8 | 51 |
| 420 | 42 | 8.4 | 8 | 52.5 |
| 430 | 43 | 8.6 | 9 | 48 |
| 440 | 44 | 8.8 | 9 | 49 |
| 450 | 45 | 8.0 | 9 | 50 |
| 460 | 46 | 9.2 | 9 | 51 |
| 470 | 47 | 9.4 | 9 | 52 |
| 480 | 48 | 9.6 | 10 | 48 |
| 490 | 49 | 9.8 | 10 | 49 |
| 500 | 50 | 10.0 | 10 | 50 |

Now considering some exemplary rows of the table, for a internal frequency of 300 MHz, the resulting count is about 30, the fractional p value is 6.0 and the integer p value is 6. Hence, the programmable divider divides the internal frequency of 300 MHz by 6 to yield a resulting output frequency of 50 MHz. For an internal frequency of 310 MHz, the resulting count is about 31, the corresponding fractional p value is 6.2, and the integer p value is 6. Hence, the internal frequency of 310 MHz is divided by 6 to yield an output frequency of about 52 MHz. For an internal frequency of 330 MHz, the resulting fractional p value is 6.6 and the integer p value is 7. Accordingly, the programmable divider divides the 330 MHz by 7 yielding an output frequency of 47 MHz.

From an examination of the values of Table I, it can be seen that the output frequency varies typically between about 47 MHz and 53 MHz. Hence, the output frequency is not necessarily set exactly to the desired frequency of 50 MHz but may be set to a slightly different value. For most applications, such is not a problem. For example, typical microprocessors can operate at a wide range of frequencies up to some maximum threshold. For example, a microprocessor may operate from as low as 4 or 5 MHz to 100 MHz. To conserve power, however, it may be desirable to operate the microprocessor at about 50 MHz and any slight variations above or below 50 MHz has no significant effect on the operability of the microprocessor.

Thus, Table I illustrates that the output frequency can be maintained fairly close to the desired frequency even though the internal frequency of the ring oscillator varies significantly from 300 MHz to 500 MHz. Any changes or drift in the frequency of the ring oscillator are accommodated by the clock multiplier of FIG. 2 as follows. As noted above, the software control unit receives an acceptable drift factor n for the output signal. The control unit calculates a lower limit and an upper limit for the current c value from the following equations:

$$ll = c - (lv * c)$$

$$ul = c + (uv * c)$$

As noted above, lv and uv represent acceptable variations in the output frequency. The variations are represented as percentages. Hence, ll represents a lower limit of acceptable count values and ul represents an upper limit on acceptable count values. If c equals 50, and lv and uv each equal 10%, then ll and ul will equal 45 and 55, respectively. The programmable comparitor compares each new count value c with the upper and lower limits ul and ll to determine whether the count has deviated from those boundaries.

Thus, the range comparitor generates an interrupt signal if the frequency of the internal signal generated by the ring oscillator drifts by an amount sufficient to deviate from acceptable ranges as represented by ul and ll values. The software control unit responds to the interrupt by retrieving the updated value for the count c from holding register 119, calculating a new value for p, and reprogramming the programmable divider with the new p value. For example, if the ring oscillator initially outputs a frequency of 300 MHz resulting in a p value of 6 and an output signal of 50 MHz, but the frequency of the ring oscillator drifts up to 330 MHz, then the range comparitor detects the drift, and the software control unit calculates a new p value of 7 resulting in a new output signal of 47 MHz. Without such an adjustment, the ring oscillator frequency of 330 MHz would continue to be divided by the original p factor of 6 resulting in an output frequency of 55 MHz. Hence, by adjusting the p value, the output frequency is maintained more closely to the desired frequency of 50 MHz. If an even greater drift occurred within the ring oscillator frequency, such as from 300 MHz to 500 MHz, the resulting output frequency would deviate substantially from the desired frequency without such as an adjustment scheme. Indeed, depending upon the application and the drift of the ring oscillator, the output frequency could deviate so much that it would not be usable by the microprocessor or other circuit receiving the output frequency.

Figure 3:
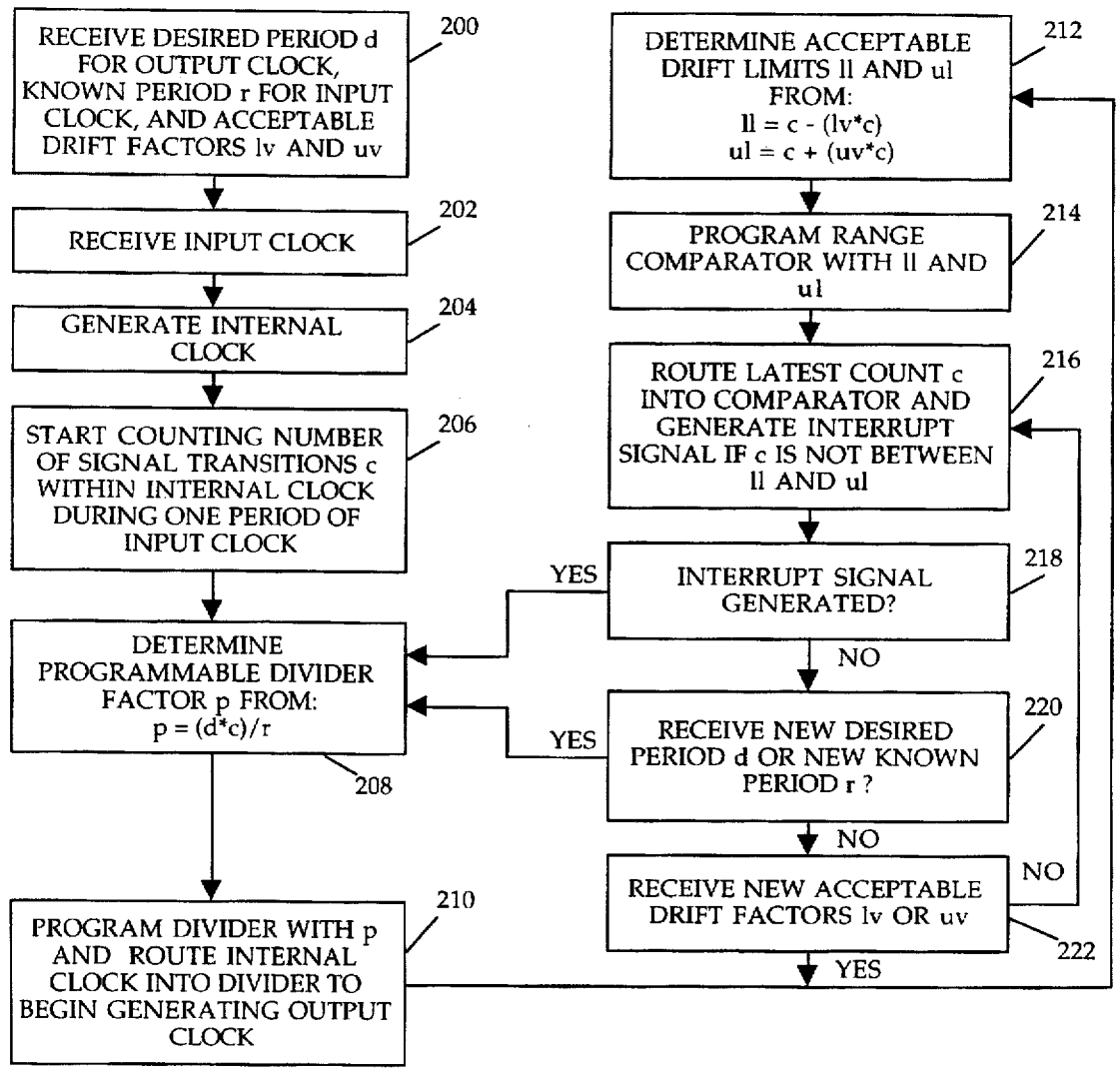
FIG. 3 is a flowchart illustrating steps performed by the clock generator of FIG. 2 to generate and maintain a clock signal having a desired frequency.

FIG. 3 summarizes the method performed by the clock multiplier of FIG. 2. Initially, at step 200, the clock multiplier receives the desired period d for the output clock, the known period r for the input clock, and the acceptable drift limit factors lv and uv. The input clock signal itself is received at step 202 and the internal clock is generated at step 204. Beginning at step 206, the counter is controller to start counting the number of signal transitions c within the internal clock during one period of the input clock. At step 208, the p factor is determined from p=(d*c)/r. The programmable divider is programmed with the p value, at step 210, and the internal clock is routed into the divider to begin generating the output clock signal.

At step 212, the acceptable drift limits of ul and ll are determined from ll=c−(lv*c) and ul=c+(uv*c). The drift limit values are employed, at step 214, to program the range comparitor. Beginning at step 216, the latest count c is routed into the comparitor and an interrupt is generated if the count c does not correspond to acceptable count values based upon the ll and ul values. The latest count value employed within step 216 may differ from the original count value used during step 208 for calculating the initial programmable divide factor as a result of drift within the internal clock signal or from other sources of drift. If an interrupt signal is generated then, at step 218, execution branches back to step 208 where a new programmable divide factor p is calculated based upon the new count value. If no interrupt signal was generated, then execution continues from step 218 to step 220 where it is determined whether a new desired output clock period d or a new value for the input clock period r has been received. If so, execution again branches to step 208 for calculation of a new p factor. If not, execution continues at step 222 where it is determined whether new acceptable drift factors have been received. If so, then execution branches back to step 212 where the drift limits are recalculated. If not, execution branches back to step 216 where the new latest count value c is compared against previously calculated drift limits.

As can be seen, steps 216–222 are executed in a loop until either new input values of d, r or uv and lv have been received or until an interrupt signal has been generated. Although not shown, the execution of the loop may also be terminated upon receipt by the controller of a reset value or the like.

Thus, FIG. 3 illustrates a flowchart summarizing a method for generating an output clock signal of known frequency based upon an internally generated clock signal of unknown frequency and an input signal of known frequency. The method may be employed within devices configured as in FIGS. 1 and 2 or within alternative devices as well. The devices of FIGS. 1 and 2 may be operated in accordance with other methods other than the one specifically illustrated in FIG. 3.

Figure 4:
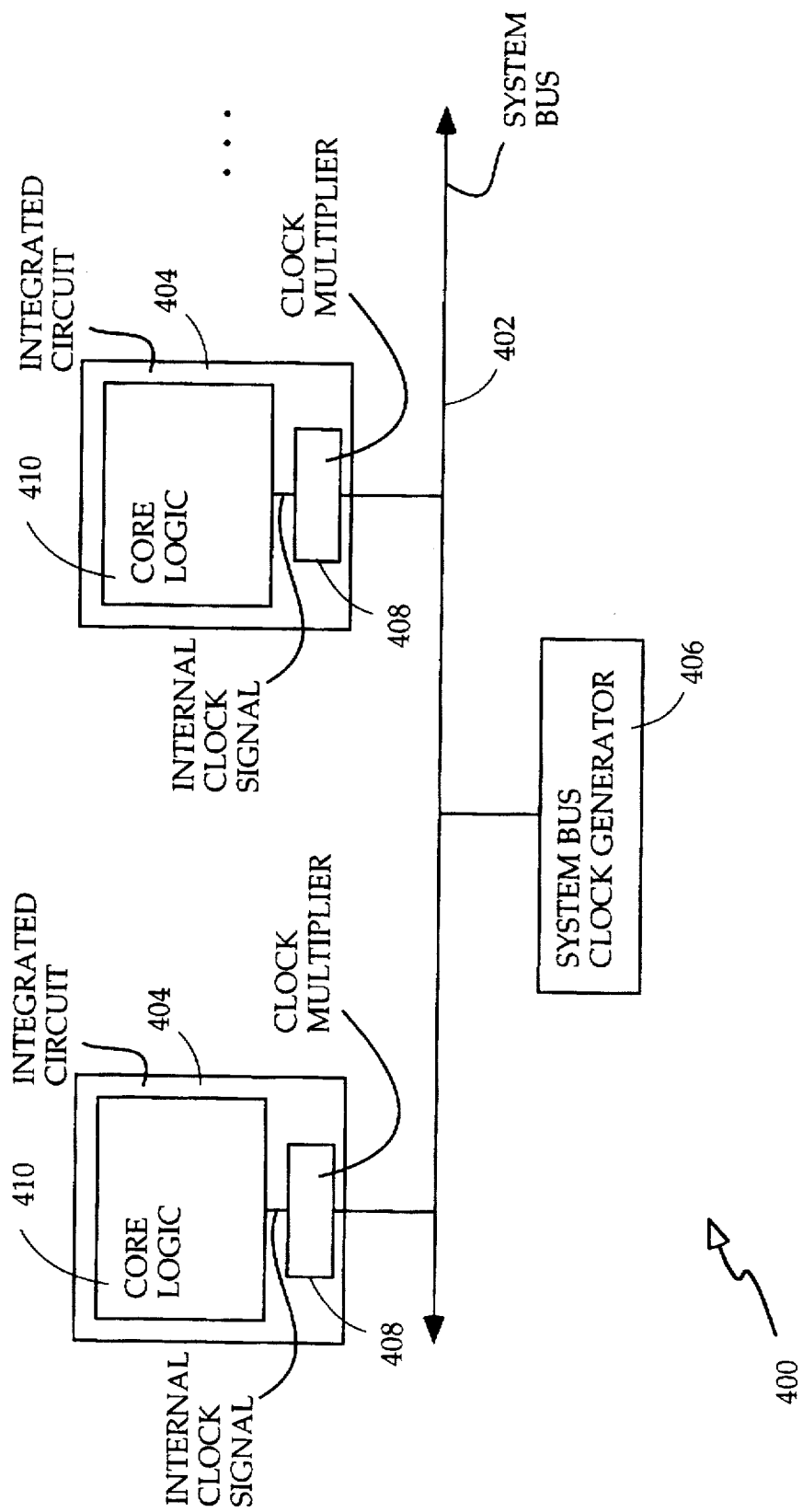
FIG. 4 is a block diagram illustrating a portion of a computer system having integrated circuits incorporating the clock generator of FIGS. 1–3.

FIG. 4 illustrates a computer system 400 having a system bus 402 and a set of IC's 404 of which two exemplary ones are shown. System bus 402 receives a system clock signal generated by a system bus clock generator 406. Each of the IC's includes a digital clock multiplier 408 configured as described above with reference to FIGS. 1–3. Each clock multiplier 408 receives the system clock from bus 402 and generates an internal clock signal of higher frequency for use by core logic circuitry 410 with in the respective IC. In general, the internal clock signals of each of the IC's may differ. For example, the system clock generated by system clock generator 406 may be 10 MHz. The clock multiplier of one of the IC's may multiply the system clock by a factor of 10 to generate an internal clock signal having a frequency of 100 MHz. The clock multiplier of another one of the IC's may multiply the system clock by only a factor of 2 to generate an internal clock signal having a frequency of 20 MHz. Typically, the clock multiplier of each respective IC is set to generate an internal clock signal at the fastest possible clock rate for reliable operation for the IC. However, in accordance with the techniques described above, it may be desirable to reduce the multiplication factor of a particular clock multiplier to generate an internal clock signal having a frequency somewhat lower than a maximum permissible clock frequency, perhaps to conserve power or to insure compatibility with other components of the system.

The components illustrated within FIG. 4 may each be mounted to a common motherboard. The various IC's may perform different operations. For example, one IC may be a microprocessor whereas another IC may be a memory controller and another IC may be a bus controller. The system bus clock generator may form a portion of the system bus or may form a portion of a component connected to the bus, such as a system bus controller. As can be appreciated, a wide range of configurations are available consistent with the general principles of the invention.

In general, the embodiments shown herein are merely provided to illustrate principles of the invention and should not be construed as limiting the scope of the invention. Rather, the invention can be implemented within a wide range of embodiments for use with a wide range of applications both to achieve the goals and objectives set forth herein and to achieve other goals and objectives as well.

What is claimed is:

1. A clock multiplier comprising:

means for generating an internal signal of unknown frequency:

means for receiving an input signal of known frequency:

means for counting the number of clock transitions within the internal signal during a predetermined portion of the input signal, connected to an output of the means for generating an internal signal and an output of the means for receiving an input signal; and means for programmably dividing frequency of a signal, connected to an output of the means for generating the internal signal and an output of the means for counting, and programmed with a value of p wherein p is equal to d*c/r and wherein d is a desired period of a signal to be generated, c is a number of transitions counted in the internal signal during one period of the input signal, and r is a known period of the input signal.

2. A clock multiplier comprising:

means for generating an internal signal of unknown frequency;

means for receiving an input signal of known frequency;

means for determining the frequency of the internal signal which compares the frequency of the internal signal and the input signal, connected to an output of the means for generating the internal signal and an output of the means for receiving the input signal;

means for generating an output signal of known frequency, with the output signal having a frequency approximately equal to a pre-selected desired frequency, connected to an output of the means for generating the internal signal and an output of the means for determining the frequency of the internal signal;

means for determining whether the frequency of the output signal deviates from a predetermined range of acceptable frequencies, connected to an output of the means for generating an output signal and an output of the means for receiving an input signal; and means for adjusting the frequency of the output signal to return to within the range of acceptable frequencies, connected to an output of the means for generating the output signal, an output of the means for receiving an input signal, and an input of the means for generating the output signal.

3. The clock multiplier of claim 2 wherein the means for determining whether the frequency of the output signal deviates from the predetermined range of acceptable frequencies comprises a programmable range compare unit connected to an output of the frequency determining means for generating an interrupt signal whenever the number of transitions of the internal signal counted by the frequency determining means does not lie within a range of acceptable count values corresponding to the range of acceptable frequencies; and wherein the means for adjusting comprises software running on a programmable microprocessor unit connected to a programmable divider of the means for generating the output signal and to the frequency determining means, said software operating in response to the interrupt signal to adjust inputs of the programmable divider to reset the frequency of the output signal to within the range of acceptable frequencies.

4. The clock multiplier of claim 3 wherein the acceptable range of frequencies is defined by a lower limit equal to c−(lv*c) and an upper limit defined by c+(uv*c) wherein c is a number of transitions counted in the internal signal during one period of the input signal and lv and uv are predetermined allowable drift factors.

5. A clock multiplier comprising:
a ring oscillator for generating an internal signal of unknown frequency;
a sample gate connected to a reference clock input line for receiving an input signal of known frequency;
a counter, connected to an output of the ring oscillator and to an output of the sample gate, for counting a number of clock signal transitions within the internal signal occurring during one clock period of the input signal; and
a programmable divider, connected to an output of the ring oscillator and an output of the counter, for generating an output signal having a frequency approximately equal to a pre-selected desired frequency wherein the programmable divider is programmed with a value of p wherein p is equal to d*c/r and wherein d is the desired period of the signal to be generated, c is the number of transitions counted in the internal signal during one period of the input signal and r is the known period of the input signal.

6. A clock multiplier comprising:
a ring oscillator for generating an internal signal of unknown frequency;
a sample gate connected to a reference clock input line for receiving an input signal of known frequency;
a counter, connected to an output of the ring oscillator and to an output of the sample gate, for counting a number of clock signal transitions within the internal signal occurring during one clock period of the input signal;
a programmable divider, connected to an output of the ring oscillator and an output of the counter, for generating an output signal having a frequency approximately equal to a pre-selected desired frequency;
a determination unit, connected to an output of the programmable divider and to an output of the sample gate, for determining whether the frequency of the output signal deviates from a predetermined range of acceptable frequencies; and an adjustment unit, connected to an output of the determination unit and an input of the programmable divider, for adjusting the frequency of the output signal to return to within the range of acceptable frequencies.

7. The clock multiplier of claim 6
wherein the determination unit comprises a programmable range compare unit connected to an output of the counter for generating an interrupt signal whenever the number of transitions counted by the counter does not lie within a range of acceptable count values corresponding to the range of acceptable frequencies; and wherein the adjustment unit comprises software running on a programmable microprocessor unit connected to the programmable divider and to the counter, said software operating in response to the interrupt signal to adjust inputs to the programmable divider to reset the frequency of the output signal to within the range of acceptable frequencies.

8. The clock multiplier of claim 7 wherein the acceptable range of frequencies is defined by a lower limit equal to c−(lv*c) and an upper limit defined by c+(uv*c) wherein c is a number of transitions counted in the internal signal during one period of the input signal and lv and uv are predetermined allowable drift factors.

9. Within a clock multiplier, employing a ring oscillator, for generating an output signal at a frequency that is some multiple of the frequency of an input signal, a method for generating the output signal comprising the steps of:
receiving an input signal of known frequency;
generating an internal signal of unknown frequency using the ring oscillator;
counting the number of signal transitions occurring within the internal signal during one clock period of the input signal;
calculating the frequency of the internal signal by multiplying the number of signal transitions counted during one clock period of the internal signal by the known frequency of the internal signal;
programming a programmable divider configured to divide the internal signal by a factor of p, wherein p is equal to d * c/r and wherein d is the desired period of the signal to be generated, c is the number of transitions counted in the internal signal during one period of the input signal and r is the known period of the input signal; and
routing the internal signal through the programmable divider to generate an output signal.

10. Within a clock multiplier, employing a ring oscillator, for generating an output signal at a frequency that is some multiple of the frequency of an input signal, a method for generating the output signal comprising the steps of:
receiving an input signal of known frequency;
generating an internal signal of unknown frequency using the ring oscillator;
determining the frequency of the internal signal based upon a comparison with the input signal of known frequency;
generating the output signal based upon the internal signal using the determined frequency thereof;
determining whether the frequency of the output signal deviates from a predetermined range of acceptable frequencies; and
if so, adjusting the frequency of the output signal to lie within-the range of acceptable frequencies.

11. The method of claim 9 further comprising the steps of:
determining whether the frequency of the output signal deviates from a predetermined range of acceptable frequencies; and
if so, reprogramming the programmable divider to generate an output signal within the range of acceptable frequencies.

12. The method of claim 11 wherein the acceptable range of frequencies is defined by a lower limit equal to $c-(lv*c)$ and an upper limit defined by $c+(uv*c)$ wherein c is a number of transitions counted in the internal signal during one period of the input signal and lv and uv are predetermined allowable drift factors.

* * * * *